(12) United States Patent
Tu et al.

(10) Patent No.: US 9,583,560 B2
(45) Date of Patent: Feb. 28, 2017

(54) POWER SEMICONDUCTOR DEVICE OF STRIPE CELL GEOMETRY

(71) Applicant: UBIQ Semiconductor Corp., Zhubei, Hsinchu County (TW)

(72) Inventors: Kao-Way Tu, Zhubei (TW); Yi-Yun Tsai, Zhubei (TW); Yuan-Shun Chang, Zhubei (TW)

(73) Assignee: UBIQ SEMICONDUCTOR CORP., Zhubei, Hsinchu County (TW)

( * ) Notice: Subject to any disclaimer, the term of this patent is extended or adjusted under 35 U.S.C. 154(b) by 16 days.

(21) Appl. No.: 14/637,457

(22) Filed: Mar. 4, 2015

(65) Prior Publication Data

US 2015/0340433 A1    Nov. 26, 2015

(30) Foreign Application Priority Data

May 20, 2014   (TW) .............................. 103117623 A

(51) Int. Cl.
| | | |
|---|---|---|
| *H01L 29/66* | (2006.01) | |
| *H01L 29/06* | (2006.01) | |
| *H01L 27/088* | (2006.01) | |
| *H01L 29/40* | (2006.01) | |

(Continued)

(52) U.S. Cl.
CPC ........ *H01L 29/0619* (2013.01); *H01L 27/088* (2013.01); *H01L 29/0692* (2013.01); *H01L 29/0696* (2013.01); *H01L 29/404* (2013.01); *H01L 29/4238* (2013.01); *H01L 29/7811* (2013.01); *H01L 29/7813* (2013.01)

(58) Field of Classification Search
CPC ............. H01L 29/0619; H01L 29/0623; H01L 29/402; H01L 29/404; H01L 29/7811; H01L 29/7823; H01L 29/0611; H01L 29/0661

USPC .......................................................... 257/409
See application file for complete search history.

(56) References Cited

U.S. PATENT DOCUMENTS 6,462,376 B1   10/2002 Wahl et al.
7,586,151 B2    9/2009 Takaya et al.
(Continued)

OTHER PUBLICATIONS

Office Action issued in corresponding Taiwan patent application on Apr. 22, 2016.

*Primary Examiner* — Jerome Jackson, Jr.
*Assistant Examiner* — John Lin
(74) *Attorney, Agent, or Firm* — McClure, Qualey & Rodack, LLP

(57) ABSTRACT

A power semiconductor device of stripe cell geometry including a substrate, a plurality of striped power semiconductor units, and a guard ring structure is provided. The substrate has an active area and a termination area surrounding the active area defined thereon. The striped semiconductor unit includes a striped gate conductive structure. The striped semiconductor units are located in the active area. The guard ring structure is located in the termination area and includes at least a ring-shaped conductive structure surrounding the striped power semiconductor units. The ring-shaped conductive structure and the striped gate conductive structures are formed on the same conductive layer, and at least one of the striped gate conductive structures is separated from the nearby ring-shaped conductive structure and electrically connected to the nearby ring-shaped conductive structure through the gate metal pad.

10 Claims, 8 Drawing Sheets

(51) Int. Cl.
*H01L 29/423* (2006.01)
*H01L 29/78* (2006.01)

(56) References Cited

U.S. PATENT DOCUMENTS

| | | | |
|---|---|---|---|
| 2004/0238884 A1* | 12/2004 | Tanaka | H01L 29/0619 257/341 |
| 2008/0087951 A1* | 4/2008 | Takaya | H01L 29/0623 257/334 |
| 2008/0135931 A1* | 6/2008 | Challa | H01L 21/3065 257/331 |
| 2013/0020635 A1 | 1/2013 | Yilmaz et al. | |
| 2013/0087852 A1 | 4/2013 | Kim et al. | |

* cited by examiner

POWER SEMICONDUCTOR DEVICE OF STRIPE CELL GEOMETRY

BACKGROUND OF THE INVENTION

1. Field of the Invention

The invention relates to a power semiconductor device; in particular, to a power semiconductor device of stripe cell geometry.

2. Description of the Prior Art

The power semiconductor device has become an important power control product due to its advantages of lower switching loss and simple driving circuit and rapid development of semiconductor manufacturing process technologies. The power semiconductor devices can be divided into trench gate power semiconductor devices and planar gate power semiconductor devices according to their different channel positions. The channel of the trench gate power semiconductor device is disposed along a direction vertical to the chip surface; the channel of the trench gate power semiconductor devices is disposed along a direction parallel to the chip surface. The power semiconductor devices can be also divided into squared cells and striped cells according to their different cell designs. The squared cell design and striped cell design both have their own advantages. In general, the squared cell design can have lower conductive resistance and the striped cell design can provide better Miller capacitance.

Figure 1A:
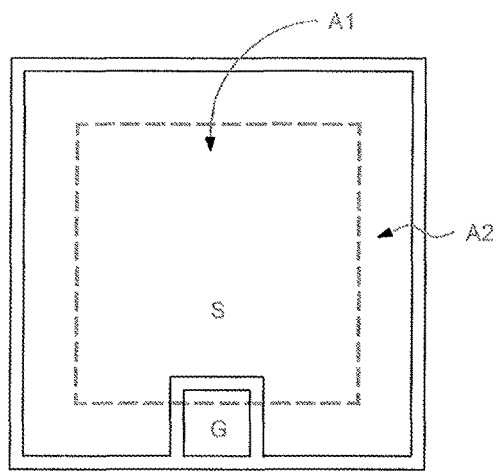

FIG. 1A illustrates a schematic diagram of a conventional power semiconductor device. As shown in FIG. 1A, a gate metal pad G and a source metal pad S are disposed on the upper surface of the power semiconductor device, and a drain metal pad (not shown in FIG. 1A) is disposed on the lower surface of the power semiconductor device. The upper surface of the power semiconductor device can be divided into an active area A1 and a termination area A2. Many power semiconductor units (cells) are located in the active area A1.

Figure 1B:
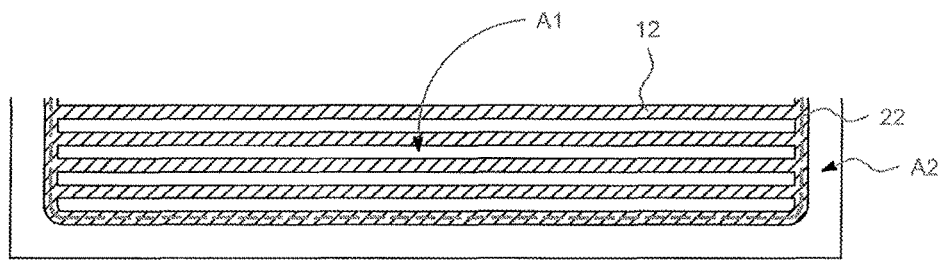
Figure 1C:
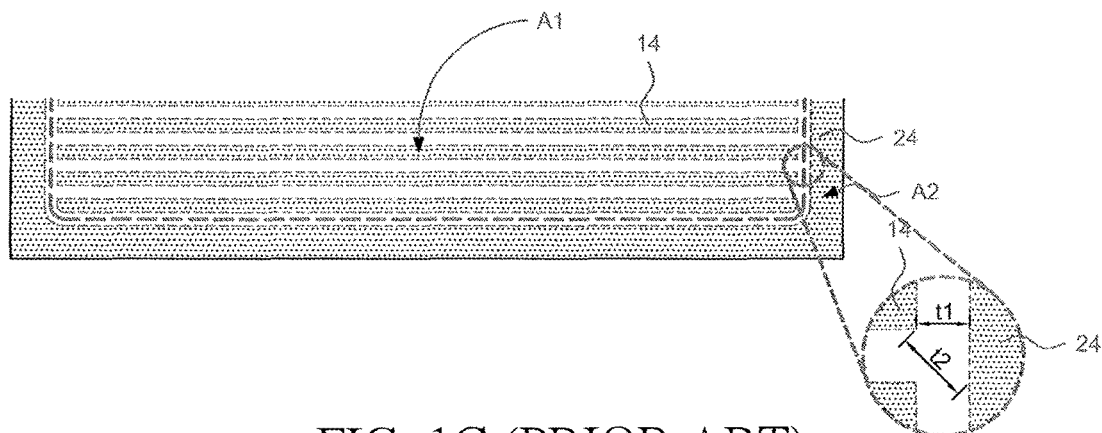

FIG. 1B and FIG. 1C illustrate schematic diagrams of the active area A1 of the power semiconductor device. In FIG. 1B and FIG. 1C, a striped cell power semiconductor device is taken as an example, and the gate metal pad G and the source metal pad S are omitted to show the striped cell in the active area A1. As shown in FIG. 1B, there are many striped gate conductive structures 12 in the active area A1, and each of the striped gate conductive structures 12 corresponds to a power semiconductor cell. The power semiconductor device has a ring-shaped conductive structure 22 surrounding the active area A1. Two ends of the striped gate conductive structure 12 are connected to the ring-shaped conductive structure 22 to obtain gate voltage for operation. FIG. 1C illustrates the distribution of the body-doped region defined by the conductive structure of FIG. 1A including the striped gate conductive structure 12 and the ring-shaped conductive structure 22. It should be noticed that the body-doped region in the active area A1 will be divided into many striped body-doped regions 14 due to the existence of the striped gate conductive structure 12. There are different distances t1 and t2 between the ends of the striped body-doped regions 14 and adjacent doped regions 24; therefore, the distribution of the electrical field around the active area A1 will be non-uniform and the performance of the power semiconductor device will become poor.

Figure 1D:
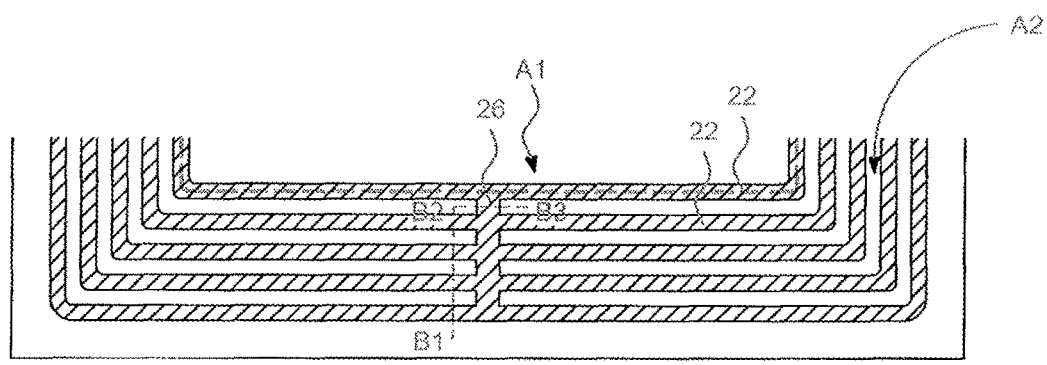
Figure 1E:
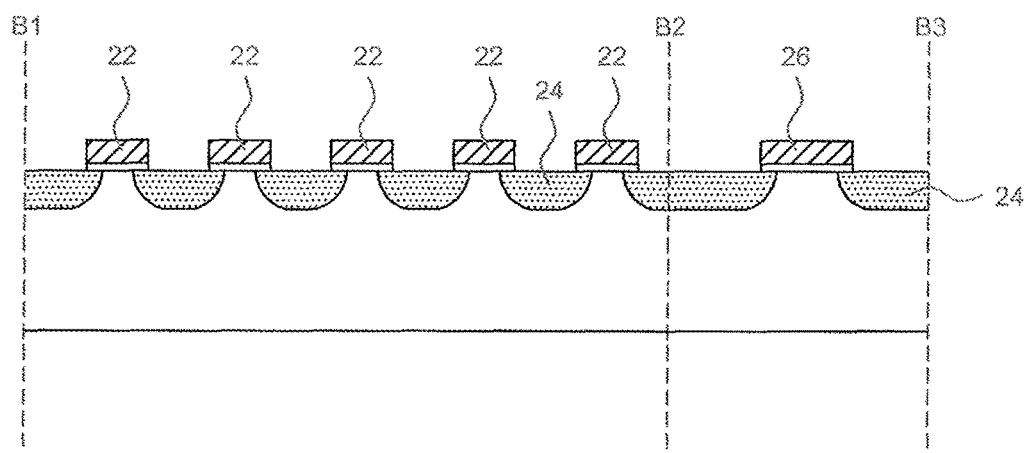

FIG. 1D and FIG. 1E illustrate schematic diagrams of the termination area A2 of the power semiconductor device. Similarly, the gate metal pad G and the source metal pad S located at the top of the chip are also omitted. As shown in FIG. 1D and FIG. 1E, there is a guard ring structure disposed in the termination area A2 of the power semiconductor device to increase the break-down voltage of the power semiconductor device. The guard ring structure includes a poly-silicon terminal pattern. The poly-silicon terminal pattern includes a poly-silicon gate bus 26 and ring-shaped poly-silicon structures 22. The ring-shaped poly-silicon structures 22 extend from two sides of the poly-silicon gate bus 26 to surround the active area A1. The poly-silicon terminal pattern defines the doped regions 24 in the substrate and the doped regions 24 surround the active area A1 in order. It should be noticed that each doped region 24 has a breach corresponding to the poly-silicon gate bus 26 due to the existence of the poly-silicon gate bus 26; therefore, voltage tolerance of the guard ring structure will be affected, and the break-down voltage of the power semiconductor device will also become smaller.

SUMMARY OF THE INVENTION

Therefore, the invention provides a power semiconductor device of stripe cell geometry to solve the above-mentioned problems occurred in the prior arts.

A scope of the invention is to provide a power semiconductor device of stripe cell geometry to solve the problem caused by the non-uniform distribution of electrical field around the active area of the power semiconductor device of stripe cell geometry.

Another scope of the invention is to provide a power semiconductor device of stripe cell geometry to solve the problem that the voltage tolerance of guard ring structure in the termination area of the power semiconductor device is affected by the breach formed in the ring-shaped doped region due to the existence of the poly-silicon gate bus.

A preferred embodiment of the invention is a power semiconductor device of stripe cell geometry. In this embodiment, the power semiconductor device of stripe cell geometry includes a substrate, a plurality of striped power semiconductor units, and a guard ring structure. The substrate has an active area and a termination area surrounding the active area defined thereon. The striped semiconductor unit includes a striped gate conductive structure. The striped semiconductor units are located in the active area. The guard ring structure is located in the termination area and includes at least a ring-shaped conductive structure surrounding the striped power semiconductor units. The ring-shaped conductive structure and the striped gate conductive structures are formed on the same conductive layer, and at least one of the striped gate conductive structures is separated from the nearby ring-shaped conductive structure and electrically connected to the nearby ring-shaped conductive structure through the gate metal pad.

In an embodiment, the ring-shaped conductive structure and the striped gate conductive structures are located in the same conductive layer.

In an embodiment, the striped gate conductive structure is electrically connected to the ring-shaped conductive structure innermost of the termination area through a gate metal pad.

In an embodiment, the ring-shaped conductive structure is a ring-shaped poly-silicon structure and the striped gate conductive structure is a striped gate poly-silicon structure.

In an embodiment, the gate metal pad is located at a side of the termination area and the gate metal pad extends an end of the striped gate conductive structure, and a long side of the gate metal pad is vertical to an alignment of the striped gate conductive structures.

In an embodiment, the gate metal pad extends into the active area from a center of a side of the termination area, and an extending direction of the gate metal pad is vertical to an alignment of the striped gate conductive structures.

In an embodiment, the power semiconductor device of stripe cell geometry further includes two gate metal pads corresponding to two opposite sides of the termination area.

In an embodiment, the striped gate conductive structure and the ring-shaped conductive structure are covered by an inter-level dielectric layer, the inter-level dielectric layer has a plurality of contact windows corresponding to the striped gate conductive structure and the ring-shaped conductive structure respectively, the gate metal pad is electrically connected to the striped gate conductive structure and the ring-shaped conductive structure through the contact windows.

In an embodiment, the gate metal pad is located above the ring-shaped conductive structures and electrically connected to at least two of the ring-shaped conductive structures.

In an embodiment, the ring-shaped conductive structures define a plurality of ring-shaped doped regions in the termination area, each ring-shaped conductive structure includes a first section and a second section, the second section is wider than the first section, the ring-shaped doped regions formed at two sides of the first section are separated to each other and the ring-shaped doped regions formed at two sides of the second section are connected to each other.

In an embodiment, each ring-shaped conductive structure further includes a third section, the third section is located at center of the second section and electrically connected to the gate metal pad, and the third section is wider than the second section.

The advantage and spirit of the invention may be understood by the following detailed descriptions together with the appended drawings.

BRIEF DESCRIPTION OF THE APPENDED DRAWINGS

FIG. 1A illustrates a schematic diagram of a conventional power semiconductor device. FIG. 1B and FIG. 1C illustrate schematic diagrams of an active area A1 of the power semiconductor device in FIG. 1A. FIG. 1D and FIG. 1E illustrate schematic diagrams of a termination area A2 of the power semiconductor device in FIG. 1A.

FIG. 2A, FIG. 2B, FIG. 2C, FIG. 2D, and FIG. 2E illustrate the first embodiment of the power semiconductor device in the invention.

Figure 3A:
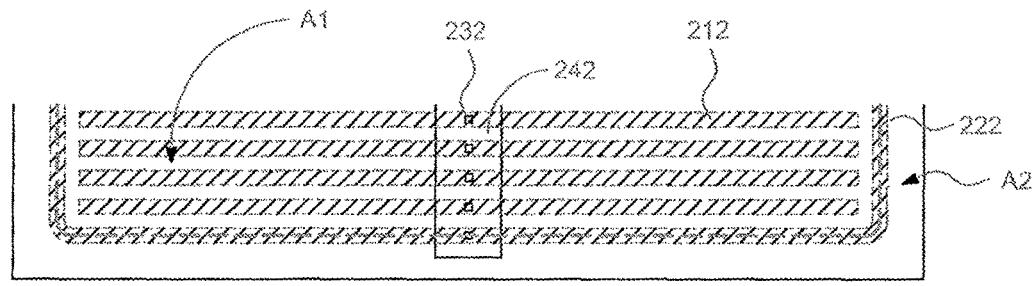
Figure 3B:
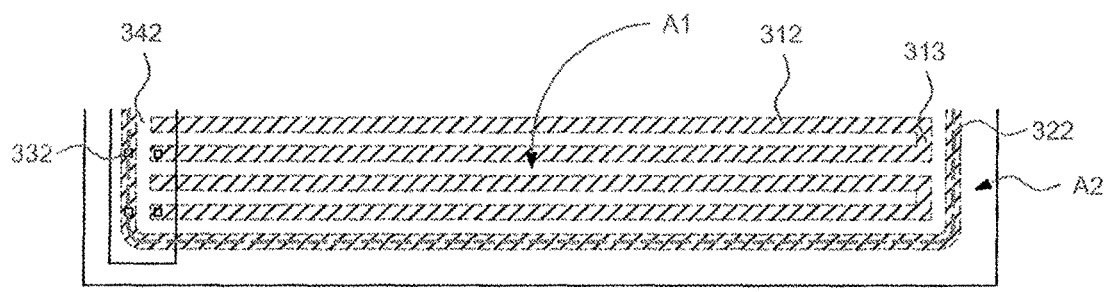

FIG. 3A illustrates the second embodiment of the power semiconductor device in the invention. FIG. 3B illustrates the third embodiment of the power semiconductor device in the invention.

Figure 4A:
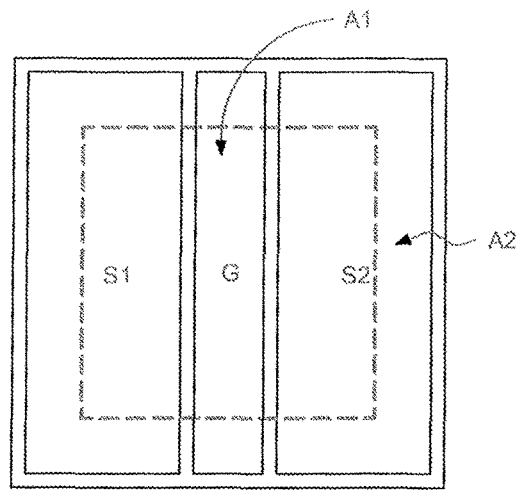
Figure 4B:
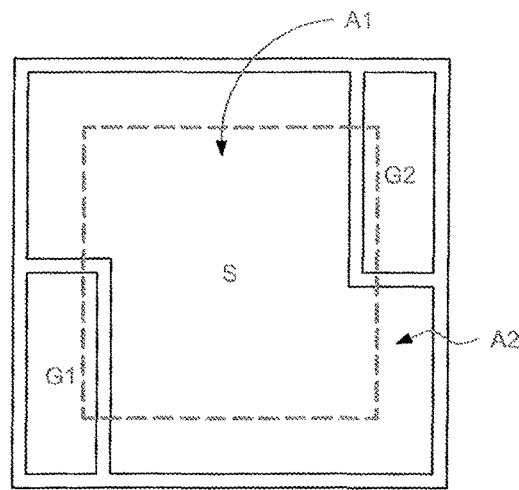
Figure 4C:
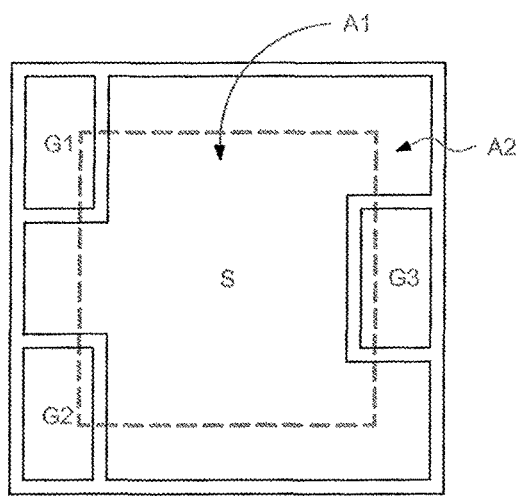

FIG. 4A, FIG. 4B, and FIG. 4C illustrate three different embodiments of the configuration of a gate metal pad G and a source metal pad S on a surface of the power semiconductor device in the invention.

FIG. 5A, FIG. 5B, FIG. 5C, and FIG. 5D illustrate the fourth embodiment of the power semiconductor device in the invention.

FIG. 6A, FIG. 6B, FIG. 6C, FIG. 6D, and FIG. 6E illustrate the fifth embodiment of the power semiconductor device in the invention.

DETAILED DESCRIPTION OF THE INVENTION

Exemplary embodiments of the present invention are referenced in detail now, and examples of the exemplary embodiments are illustrated in the drawings. Further, the same or similar reference numerals of the elements/components in the drawings and the detailed description of the invention are used on behalf of the same or similar parts.

In the following embodiments, the term "coupled" can be various types of directly coupled, indirectly coupled, or electrically connected without limiting their connection relationship. The term "circuit" represents at least one element or elements which are actively and/or passively coupled to provide appropriate functions. The term "signal" represents at least one current, voltage, load, temperature, data, or other signals. The term "resistance unit" represents at least one resistor or a resistor network including at least one resistor and other components. The term "level" represents the current value or voltage value of at least one signal.

Figure 2A:
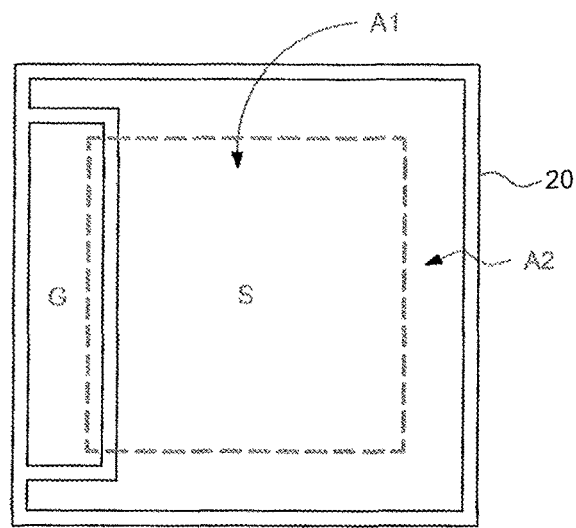
Figure 2B:
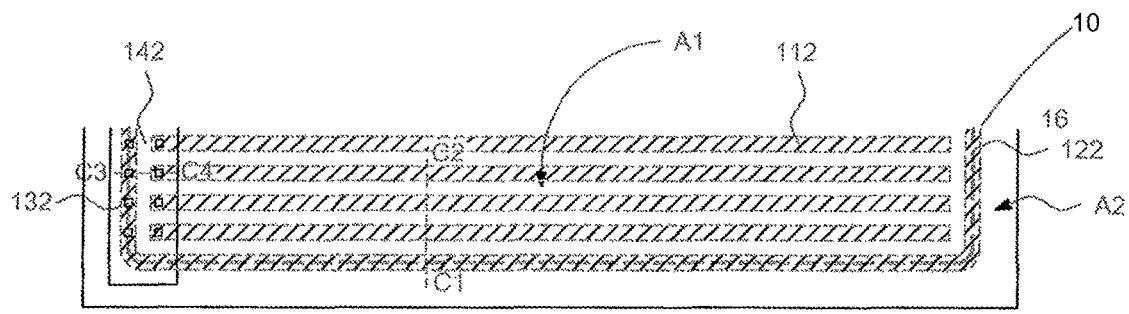
Figures 2C, 2D:
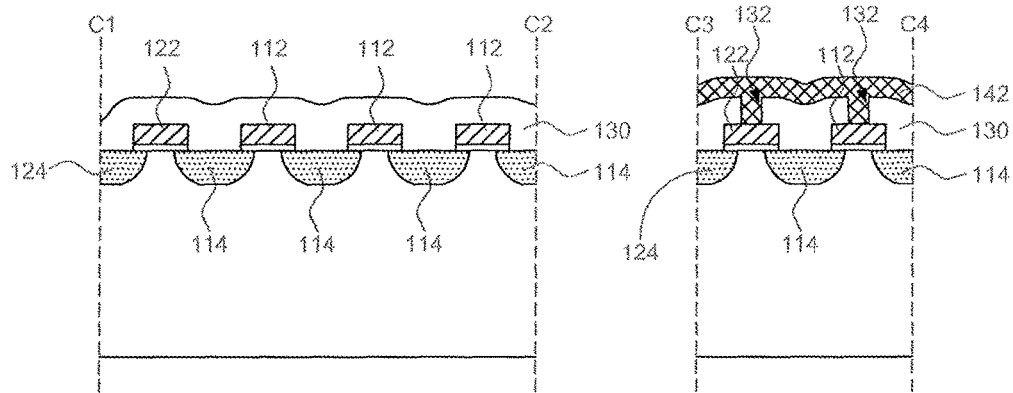
Figure 2E:
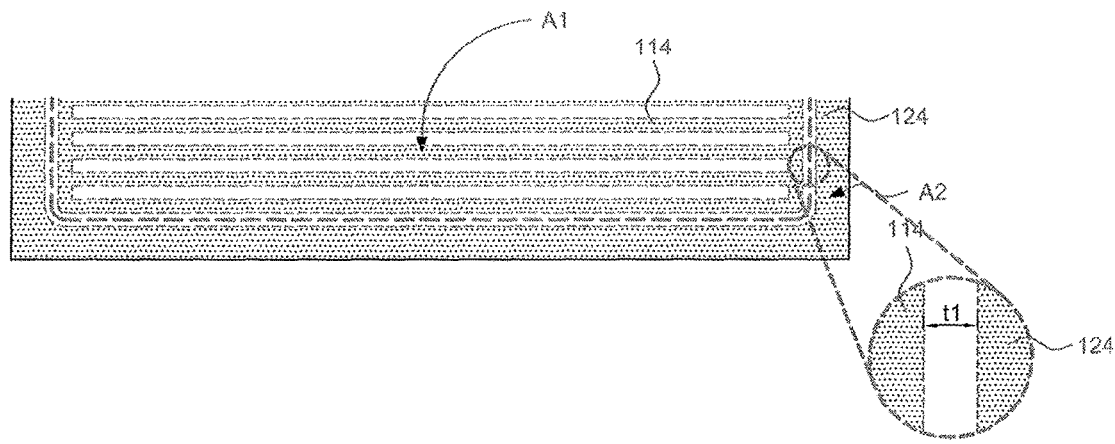

Please refer to FIG. 2A, FIG. 2B, FIG. 2C, FIG. 2D, and FIG. 2E. FIG. 2A, FIG. 2B, FIG. 2C, FIG. 2D, and FIG. 2E illustrate the first embodiment of the power semiconductor device in the invention. This power semiconductor device is configured in a striped structure. FIG. 2A illustrates the configuration of a gate metal pad G and a source metal pad S on a surface of the power semiconductor device; FIG. 2B illustrates a top view of a striped cell structure in an active area A1 of the power semiconductor device; FIG. 2C and FIG. 2D illustrate cross-sections corresponding to the C1-C2 hatch and the C3-C4 hatch in FIG. 2B; FIG. 2E illustrates the distribution of a body-doped region 114 in the active area A1 of the power semiconductor device of this embodiment.

As shown in FIG. 2A, FIG. 2B, FIG. 2C, FIG. 2D, and FIG. 2E, this power semiconductor device includes a substrate 20, striped power semiconductor cells, and a guard ring structure 10. The active area A1 and a termination area A2 are defined on a surface of the substrate 20. The termination area A2 is disposed out of the active area A1. The striped power semiconductor cells are disposed in the active area A1. In practical applications, these striped power semiconductor cells can have a trench gate power semiconductor structure or a planar gate power semiconductor.

As shown in FIG. 2B, each striped power semiconductor cell has a striped gate conductive structure 112 transversely extending in the active area A1. If the striped power semiconductor cell has the trench gate power semiconductor structure, the striped gate conductive structure 112 is disposed in a trench formed on the surface of the substrate; if the striped power semiconductor cell has the planar gate power semiconductor structure, the striped gate conductive structure 112 is disposed on the surface of the substrate. The guard ring structure 10 is disposed in the termination area A2 and the guard ring structure 10 includes at least one ring-shaped conductive structure 122 (FIG. 2B only shows the innermost ring-shaped conductive structure 122). This ring-shaped conductive structure 122 surrounds the striped power semiconductor cell disposed in the active area A1.

Please refer to FIG. 2C and FIG. 2D. The ring-shaped conductive structure 122 and the striped gate conductive structure 112 are disposed in the same conductive layer. In other words, the ring-shaped conductive structure 122 and the striped gate conductive structure 112 can be formed on the substrate by the same lithography etching process. In a preferred embodiment, the conductive layer can be a conductive poly-silicon layer.

In this embodiment, it should be noticed that two ends of each striped gate conductive structure 112 are separated from the innermost ring-shaped conductive structure 122 of the guard ring structure 10 as shown in FIG. 2B. Please also refer to FIG. 2E. The body-doped region 114 is defined and formed in the active area A1 through this conductive pattern including the striped gate conductive structure 112 and the ring-shaped conductive structure 122. There is a distance t1 between the body-doped region 114 and a doped region 124 in the termination area A2, so that non-uniform electric field distribution can be avoided around the active area A1.

Please refer to FIG. 2B and FIG. 2D. Although the striped gate conductive structure 112 and the ring-shaped conductive structure 122 are separated, the striped gate conductive structure 112 and the ring-shaped conductive structure 122 are covered by an inter-level dielectric layer 130, and the inter-level dielectric layer 130 has a plurality of contact windows 132 corresponding to the striped gate conductive structures 112 and the ring-shaped conductive structures 122 respectively. The gate metal pad 142 is disposed above these contact windows 132 and the gate metal pad 142 is electrically connected to the striped gate conductive structure 112 and the innermost ring-shape conductive structure 122 of the termination area A2.

As shown in FIG. 1A, the gate metal pad G of the conventional power semiconductor device is disposed at the center of one side of the chip; on the other hand, as shown in FIG. 2A, the gate metal pad G of the power semiconductor device in this embodiment is disposed at one side (e.g., the left side in FIG. 2A) of the termination area A2 and the gate metal pad G extends to cover the edge area of the active area A1. Furthermore, the gate metal pad G of the power semiconductor device in this embodiment extends to cover an end of the striped gate conductive structure 112, and a long side of the gate metal pad G is vertical to an alignment of the striped gate conductive structure 112.

FIG. 3A illustrates a second embodiment of the power semiconductor device of the invention. Different from the gate metal pad 142 of FIG. 2A located at one side of the active area A1, the gate metal pad 242 of FIG. 3A extends inward from the center of one side of the termination area A2. The gate metal pad 242 is disposed above the striped gate conductive structures 212 and the ring-shaped conductive structures 222, and the gate metal pad 242 is electrically connected to the striped gate conductive structures 212 and the ring-shaped conductive structures 222 through the contact windows 232.

FIG. 3B illustrates a third embodiment of the power semiconductor device of the invention. In this embodiment, two adjacent striped gate conductive structures 312 are connected through a vertical connection structure 313 to form a C-shaped conductive structure. The configuration of the gate metal pad 342 shown in FIG. 3B is similar with the configuration of the gate metal pad 142 shown in FIG. 2A. However, the gate metal pad 342 is electrically connected to one end of the C-shaped conductive structure and the ring-shaped conductive structures 322 through the contact windows 332. Therefore, the gate metal pad 342 of FIG. 3B needs fewer contact windows 332 than the gate metal pad 142 of FIG. 2A.

FIG. 4A, FIG. 4B, and FIG. 4C illustrate three different embodiments of the configuration of the gate metal pad G and the source metal pad S on a surface of the power semiconductor device in the invention. In FIG. 4A, the gate metal pad G extends from the center of one side of the chip to opposite side of the chip and two source metal pads S1 and S2 are disposed at two sides of the gate metal pad G. The gate metal pad G can be electrically connected to the striped gate conductive structures 212 in the active area A1 in a way similar with that shown in FIG. 3A.

The power semiconductor device of FIG. 4B has two gate metal pads G1 and G2. These two gate metal pads G1 and G2 correspond to two opposite sides of the termination area A2. These two gate metal pads G1 and G2 can be electrically connected to the striped gate conductive structures 112, 312 in the active area A1 in a way similar with that shown in FIG. 2A or FIG. 3B. The power semiconductor device of FIG. 4C has three gate metal pads G1, G2, and G3. These three gate metal pads G1, G2, and G3 are disposed at two opposite sides of the chip. As shown in FIG. 4C, the gate metal pads G1 and G2 are disposed at a first side of the chip, and the gate metal pad G3 is disposed at a second side opposite to the first side of the chip. These three gate metal pads G1, G2, and G3 can be electrically connected to the striped gate conductive structures 112, 312 in the active area A1 in a way similar with that shown in FIG. 2A or FIG. 3B.

Figure 5A:
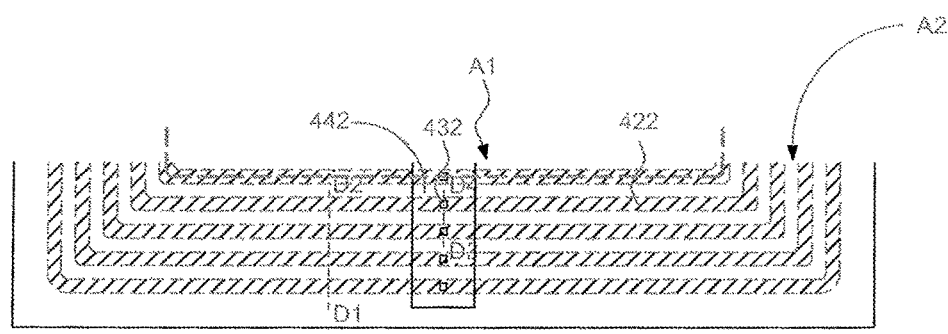
Figure 5B:
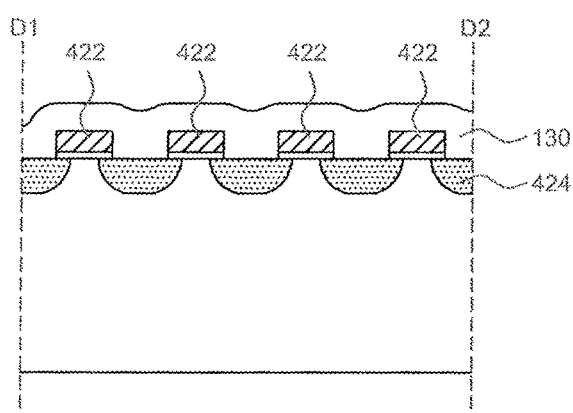
Figure 5C:
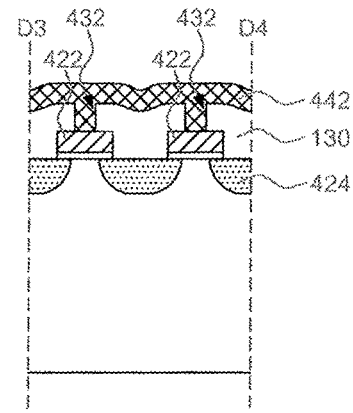
Figure 5D:
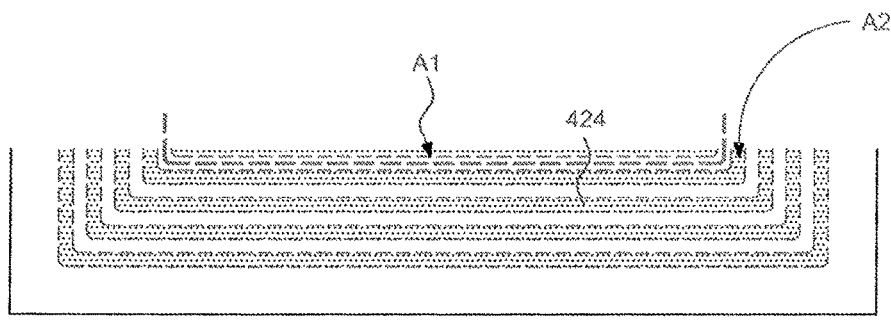

FIG. 5A, FIG. 5B, FIG. 5C, and FIG. 5D illustrate a fourth embodiment of the power semiconductor device of the invention. FIG. 5A illustrates a top view of the ring-shaped conductive structures 422 in the termination area A2 of the power semiconductor device; FIG. 5B and FIG. 5C illustrate cross-sections corresponding to the D1-D2 hatch and the D3-D4 hatch in FIG. 5A; FIG. 5D illustrates the distribution of a doped region 424 in the termination area A2 of the power semiconductor device of this embodiment.

As shown in FIG. 5A, the guard ring structure in the termination area A2 includes the ring-shaped conductive structures 422 (e.g., five ring-shaped conductive structures 422 in FIG. 5A). The gate metal pad 442 is disposed above these ring-shaped conductive structures 422, and the gate metal pad 442 is electrically connected to the ring-shaped conductive structures 422 through the contact windows 432. Therefore, the ring-shaped conductive structures 422 will have the same voltage. In a preferred embodiment, the ring-shaped conductive structures 422 can be constituted by the conductive poly-silicon material, and the ring-shaped conductive structures 422 can be formed in the termination area A2 by the gate poly-silicon structure forming way. In addition, the ring-shaped conductive structures 422 in this embodiment are disposed on the surface of the substrate, so that the ring-shaped conductive structures 422 can be cooperated with the planar gate power semiconductor structure. However, in another embodiment, the ring-shaped conductive structures 422 can be also formed in the trench and cooperated with the trench gate power semiconductor structure.

As shown in FIG. 1C, each doped region 24 in the conventional guard ring structure has a breach due to the existence of the poly-silicon gate bus 26; therefore, the voltage tolerance of the conventional guard ring structure is affected. On the other hand, as shown in FIG. 5D, the gate metal pad 442 disposed above the ring-shaped conductive structures 422 is used as a conductive structure in this embodiment of the invention to electrically connect the ring-shaped conductive structures 422. Since the gate metal pad 442 is disposed above the ring-shaped conductive structures 422, the doped regions 424 will not affected by the gate metal pad 442. Therefore, complete doped regions 424 can be formed in this embodiment of the invention and the break-down voltage of the power semiconductor device can be increased.

Figure 6A:
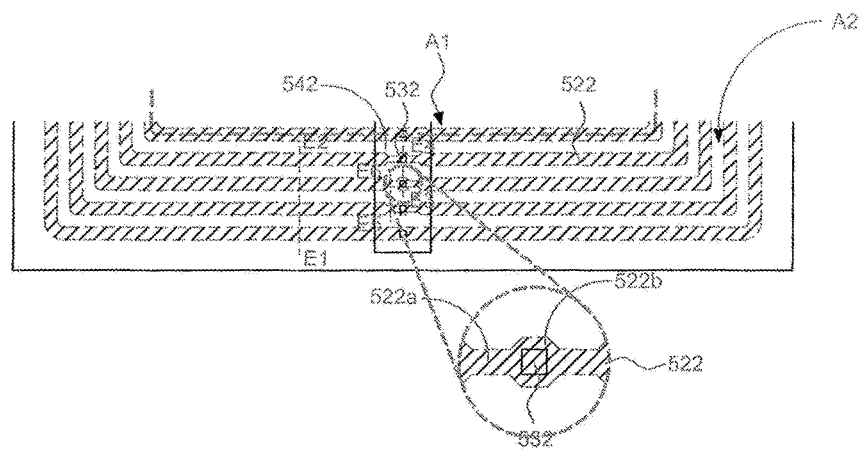
Figures 6B, 6C, 6D:
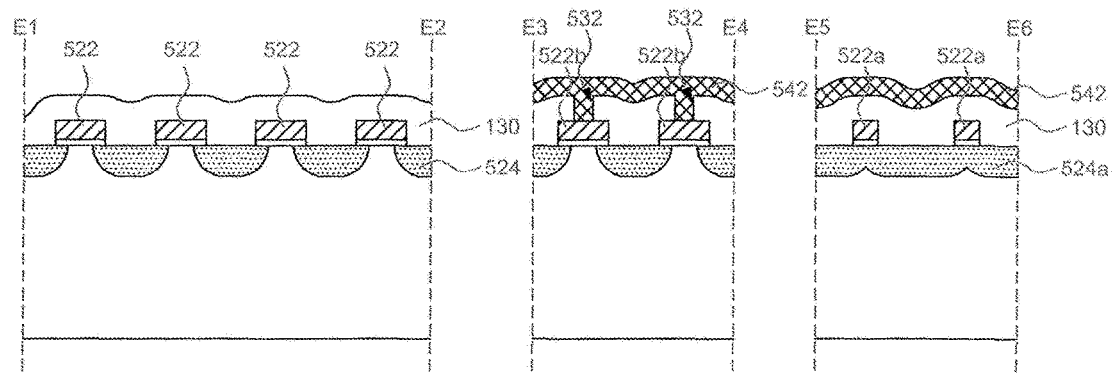

FIG. 6A, FIG. 6B, FIG. 6C, FIG. 6D, and FIG. 6E illustrate a fifth embodiment of the power semiconductor device of the invention. FIG. 6A illustrates a top view of the ring-shaped conductive structures 522 in the termination area A2 of the power semiconductor device; FIG. 6B, FIG. 6C, and FIG. 6D illustrate cross-sections corresponding to the E1-E2 hatch, the E3-E4 hatch, the E5-E6 hatch in FIG.

Figure 6E:
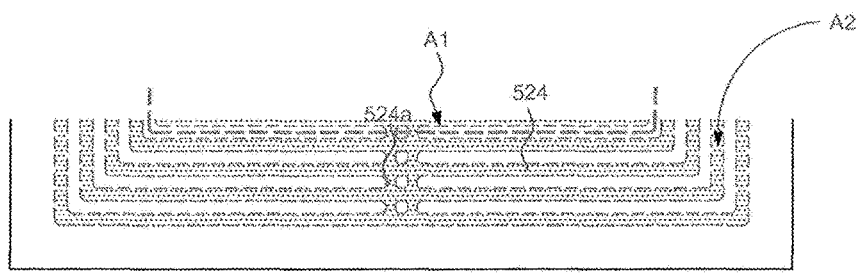

6A; FIG. 6E illustrates the distribution of a doped region 524 in the termination area A2 of the power semiconductor device of this embodiment.

Different from the ring-shaped conductive structures 422 having the same width in the fourth embodiment of the invention, the ring-shaped conductive structures 522 shown in FIG. 6A has a first section (namely the main part of the ring-shaped conductive structures 522) and a second section 522a (namely the part corresponding the gate metal pad 542). The width of the second section 522a is smaller than that of the first section 522. Please refer to FIG. 6B and FIG. 6D. FIG. 6B illustrates a cross-section corresponding to the first section 522; FIG. 6D illustrates a cross-section corresponding to the second section 522a. By properly controlling the ion implantation parameters, the ring-shaped doped regions 524 at two sides of the first section 522 are separated and the ring-shaped doped regions 524a at two sides of the second section 522a are connected to form a conductive channel between adjacent ring-shaped doped regions 524a.

In addition, as shown in FIG. 6A, in order to provide sufficient space for the contact windows 532 to electrically connect to the gate metal pad 542, the ring-shaped conductive structure 522 further has a third section 522b. The third section 522b is disposed at the center of the second section 522a and the width of the third section 522b is larger than that of the second section 522a. Please also refer to FIG. 6C. The contact windows 532 are disposed above the third section 522b. The gate metal pad 542 is electrically connected to the third section 522b through the contact windows 532.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A power semiconductor device of stripe cell geometry, comprising:
   a substrate, the substrate having an active area and a termination area surrounding the active area defined thereon;
   a plurality of striped power semiconductor units, the striped power semiconductor units being located in the active area, each of the striped power semiconductor units comprising a striped gate conductive structure; and
   a guard ring structure, the guard ring structure being located in the termination area and comprising at least a ring-shaped conductive structure surrounding the striped power semiconductor units,
   wherein a body-doped region is defined in the active area through the striped gate conductive structure and a doped region is defined in the termination area through the ring-shaped conductive structure, and there is a fixed distance between the body-doped region and the doped region, at least one of the striped gate conductive structures is separated from the ring-shaped conductive structure innermost of the termination area, a gate metal pad is located above the ring-shaped conductive structures and electrically connected to at least two of the ring-shaped conductive structures.

2. The power semiconductor device of stripe cell geometry of claim 1, wherein the ring-shaped conductive structure and the striped gate conductive structures are located in the same conductive layer.

3. The power semiconductor device of stripe cell geometry of claim 1, wherein the striped gate conductive structure is electrically connected to the ring-shaped conductive structure innermost of the termination area through a gate metal pad.

4. The power semiconductor device of stripe cell geometry of claim 3, wherein the gate metal pad is located at a side of the termination area and the gate metal pad extends to cover an end of the striped gate conductive structure, and a long side of the gate metal pad is vertical to an alignment of the striped gate conductive structures.

5. The power semiconductor device of stripe cell geometry of claim 3, wherein the gate metal pad extends into the active area from a center of a side of the termination area, and an extending direction of the gate metal pad is vertical to an alignment of the striped gate conductive structures.

6. The power semiconductor device of stripe cell geometry of claim 1, wherein the ring-shaped conductive structure is a ring-shaped poly-silicon structure and the striped gate conductive structure is a striped gate poly-silicon structure.

7. The power semiconductor device of stripe cell geometry of claim 1, further comprising two gate metal pads corresponding to two opposite sides of the termination area.

8. The power semiconductor device of stripe cell geometry of claim 1, wherein the striped gate conductive structure and the ring-shaped conductive structure are covered by an inter-level dielectric layer, the inter-level dielectric layer has a plurality of contact windows corresponding to the striped gate conductive structure and the ring-shaped conductive structure respectively, a gate metal pad is electrically connected to the striped gate conductive structure and the ring-shaped conductive structure through the contact windows.

9. The power semiconductor device of stripe cell geometry of claim 1, wherein the ring-shaped conductive structures define a plurality of ring-shaped doped regions in the termination area, each ring-shaped conductive structure comprises a first section and a second section, the second section is wider than the first section, the ring-shaped doped regions formed at two sides of the first section are separated to each other and the ring-shaped doped regions formed at two sides of the second section are connected to each other.

10. The power semiconductor device of stripe cell geometry of claim 9, wherein each ring-shaped conductive structure further comprises a third section, the third section is located at center of the second section and electrically connected to the gate metal pad, and the third section is wider than the second section.

* * * * *